US005696019A

United States Patent [19]
Chang

[11] Patent Number: 5,696,019
[45] Date of Patent: Dec. 9, 1997

[54] SELF-ALIGNED TRENCH ISOLATION FOR MEMORY ARRAY USING SIDEWALL SPACERS

[75] Inventor: Yun Chang, Hsinchu, Taiwan

[73] Assignee: Macronix International Co., Ltd., Hsinchu, Taiwan

[21] Appl. No.: 669,652

[22] Filed: Jun. 24, 1996

[51] Int. Cl.[6] .................................................. H01L 21/76
[52] U.S. Cl. .................................. 437/67; 437/52; 437/72; 198/DIG. 50
[58] Field of Search ........................ 437/67, 72, 52; 198/DIG. 50

[56] References Cited

U.S. PATENT DOCUMENTS

| | | |
|---|---|---|
| 4,139,442 | 2/1979 | Bondur et al. . |
| 4,597,060 | 6/1986 | Mitchell et al. . |
| 5,387,534 | 2/1995 | Prall ............................ 437/52 |
| 5,526,307 | 6/1996 | Yiu et al. . |
| 5,559,048 | 9/1996 | Inoue ........................... 437/67 |

OTHER PUBLICATIONS

Aritome, et al., "A 0.67 μm$^2$ Self–Aligned Shallow Trench Isolation Cell(SA–STI Cell) For 3V–only 256Mbit NAND EEPROMs," IEDM, pp. 61–64, (1994).

Kato, et al., "A 0.4μm$^2$ Self–Aligned Contactless Memory Cell Technology Suitable for 256–Mbit Flash Memories," IEDM, pp. 921–923, (1994).

*Primary Examiner*—Trung Dang
*Attorney, Agent, or Firm*—Wilson Sonsini Goodrich & Rosati

[57] ABSTRACT

A self-aligned trench isolation technique is provided which produces narrower source and drain regions and isolation structures through the use of sidewall spacers. The process involves forming a multilayer structure over a silicon substrate which includes a conductive material, an insulating material, and a first protective layer. A photoresist masking process is performed on the multilayer structure to define columns of the multilayer structure. A second protective layer is then deposited and etched back to form sidewall spacers adjacent the columns of the multilayer structure. The width of the sidewall spacers is used to define the width of the source and drain regions. Isolation trenches are made using a high selectivity etch which etches through the silicon substrate faster than the protective layers forming the sidewall spacers and covering the columns of the multilayer structure. The isolation trenches are filled with an insulating material, optionally using an etch back step to planarize the insulating layer.

36 Claims, 3 Drawing Sheets

SELF-ALIGNED TRENCH ISOLATION FOR MEMORY ARRAY USING SIDEWALL SPACERS

BACKGROUND OF THE INVENTION

1. Field of the Invention

The present invention relates to the manufacture of high density integrated circuit memory arrays; and more particularly to the formation of isolation structures within such memory arrays. The invention is particularly suited to non-volatile memory, such as read-only memory, EPROM, EEPROM, and flash memory.

2. Description of Related Art

In the manufacture of high density memory, array density is largely determined by the memory cell layout, and by the scalability of that layout with shrinking critical dimensions. As the critical dimensions shrink below the half micron area, scalabililty of the layout becomes limited by the resolution of the manufacturing process, and by the alignment tolerances which can be achieved with the masks used in the design. The alignment of masks is limited by the mechanical techniques used to place the mask over a wafer in process, and by the techniques used to consistently print patterns on masks in alignment from mask to mask. To control alignment tolerances in a chip design, it is desirable to use fewer alignment critical masks, because the alignment tolerances accumulate to cause misalignment errors in the layout of the array. Thus, so-called "self-aligned" processing steps have been developed.

Many high density memory designs require isolation structures between columns of cells in the array. In order to increase the density of the memory array, it is desirable to minimize the dimensions of the isolation structures. However, the size to which the isolation structures can be reduced is limited by the process used to form the isolation structures and the resulting alignment of the structures within the memory array.

Traditionally, isolation structures have been formed using a thermal field oxide process, such as well-known LOCOS. The traditional approach has involved a mask step to identify the isolation areas, followed by the process of growing a thick field oxide in these areas. After establishment of the isolation structures, masking steps to form the memory cells are carried out. Therefore, the alignment tolerances involved in the formation of the isolation structures, and the alignment tolerances involved in the layout of the memory cells in the array combine to cause misalignment which can have substantial impacts on performance, particularly with arrays using very small critical dimensions.

One prior art approach is described in Kim, K. S., et al., IEDM 94 pp. 921–923. In this reference, the isolation structures are formed which are self-aligned with the floating gate structures in a non-volatile memory. This prior art process involves patterning floating gate polysilicon into a plurality of columns. This polysilicon is topped with an oxide layer, and then covered by a thick silicon nitride layer, and anisotropically etched back. This leaves thick silicon nitride side walls on the columns of floating gate polysilicon. This structure is then exposed to a thermal oxidation process causing development of field oxide in the regions between the floating gate polysilicon columns, and spaced away from the floating gates by the silicon nitride spacers, which inhibit oxide growth. The spacers are then removed and the source and drain implants are carried out using the floating gate polysilicon for self-alignment. Thus, the source and drain diffusion regions are self-aligned between the floating gate polysilicon and the field oxide regions. A planarization process is executed, followed by formation of the balance of the array.

This prior art process achieves self-aligned isolation for the memory array. However, it suffers several disadvantages. In particular, the presence of silicon nitride over the floating gate, particularly in the region of the tunnel oxide between the floating gate and substrate, during the high temperature thermal oxidation process causes stresses on the structure due to the different coefficients of thermal expansion of silicon nitride and silicon dioxide. Stresses degrade device reliability. In addition, the high temperature process used to grow the isolation oxide, exposes the interface between the tunnel oxide and the polysilicon to high temperature, causing an increase in grain growth at that interface, and degrading device performance.

Furthermore, the traditional field oxide approach to forming isolation structures results in an uneven surface topology. Thus, additional planarization steps are required to be utilized after layout of the memory array, and before depositing interconnect structures above the memory array.

It is desirable to provide a self-aligned process for the formation of isolation structures which overcomes problems discussed above with respect to the prior art. In particular, it is desirable to reduce the size of the isolation structures formed. It is also desirable to provide isolation structures which simplify planarization processes.

SUMMARY OF THE INVENTION

The present invention provides a self-aligned trench isolation technique which produces narrower source and drain regions and isolation structures through the use of sidewall spacers. The process involves forming a multilayer structure over a silicon substrate which includes a conductive material, and an insulating material. A protective layer, such as an oxide, covers the multilayer structure. A photoresist masking process is performed on the multilayer structure to define columns of the multilayer structure. In one embodiment, the openings between the multilayer lines have widths less than about 500 nm.

A second protective layer is deposited over the mutilayer structure and etched back to form sidewall spacers adjacent the columns of the multilayer structure. The widths of the sidewall spacers are used to define the widths of the source and drain regions. In one embodiment, the sidewall spacers have widths between about 150 nm and 200 nm. This causes the source and drain regions defined by the conductive region positioned beneath the sidewall spacers to also have widths between about 150 nm and 200 nm.

Isolation trenches are made using a high selectivity etch which etches through the silicon substrate faster than the second protective layer forming the sidewall spacers and the first protective layer covering the columns of the multilayer structure. Once formed, the isolation trenches are filled with an insulating material, optionally using an etch back step to planarize the insulating layer. The width of the isolation trench formed is dependent on the size of the openings between the multilayer lines and the widths of the sidewall spacers. In one embodiment, the isolation openings have widths less than about 200 nm and in another embodiment less than about 150 nm.

Thus, according to the present invention, a single masking step is used to define diffusion regions, columns of a multilayer structure including a layer of polysilicon, and isolation trenches. The mask used to form columns of the multilayer structure and to define the sidewall spacers and isolation structures does not need to be critically aligned, removing the alignment tolerance for formation of the isolation structures out of the layout of the array. Further, by forming sidewall spacers adjacent the columns of the multilayer structure, narrower source and drain regions and isolation structures can be formed.

In one embodiment, the present invention can be characterized as a method for manufacturing an integrated circuit memory array, such as a read-only memory or a floating gate memory array. The method includes forming a multilayer structure which includes an insulating material, and a conductive material used for the gates or floating gates on a semiconductor substrate. The multilayer structure also includes a first protective layer covering the conductive layer. The first protective layer serves in a later etching step to protect the multilayer structure from being etched. A pattern is etched in the multilayer structure having a plurality of substantially parallel multilayer lines with openings between the multilayer lines. A doping material is deposited in the semiconductor substrate through the openings to define a plurality of substantially parallel conductive regions in the semiconductor substrate.

A second protective layer is then formed over the parallel multilayer lines and conductive regions. The protective layer is etched back to form sidewall spacers adjacent the parallel multilayer lines. These sidewall spacers cover portions of the conductive regions to define buried source and drain regions. Hence, the width of the sidewall spacers is determinative of the width of the source and drain regions.

An etch process is then applied which etches the conductive regions faster than the first protective layer covering the multilayer lines and second protective layer forming the sidewall spacers. This etching process forms trenches in the conductive regions positioned between the sidewall spacers. Once etched, the trenches are filled with an insulating material.

According to one embodiment, the step of filling the trenches includes filling regions between the lines of multilayer structure such that the insulating material is substantially coplanar with a top surface of the multilayer structure. This may be accomplished, for example by performing an etch to planarize the insulating layer.

For floating gate memory, a masking step is utilized to define the floating gates and word lines in a direction orthogonal to the multilayer lines, to form an integrated circuit memory array.

According to another aspect of the invention, after the step of filling the trenches, a second plurality of lines of conductive material is formed over, and in electrical contact with, the multilayer lines to form composite floating gate conductors. The second plurality of lines are wider than the underlying multilayer lines in order to establish a greater effective floating gate width to control the coupling ratio of the device. A pattern is etched in the composite floating gate conductors to form the floating gate structures which are covered by insulators and word lines to form the resulting devices.

The present invention can be applied in combination with other processing techniques to form a variety of memory arrays, including standard AND or NAND type arrays.

The multilayer structure according to a preferred embodiment includes a tunnel oxide covered by a floating gate polysilicon material. A thin layer of oxide is deposited over the floating gate polysilicon material and serves as the first protective layer. This composite multilayer structure is then masked and etched as discussed above. According to the present invention, the second protective layer used to form the sidewall spacers is preferably an oxide.

Accordingly, the present invention provides a technique in which the polysilicon, the buried diffusion, and the isolation trenches are self-aligned. The present invention also provides a technique by which sidewall spacers are used to reduce the widths of the source and drain regions and the isolation trenches formed. This technique allows very small critical dimensions to be applied in the layout of the array, without requiring allocation of area to allow for misalignment of the buried diffusion and polysilicon layers with the isolation oxides. In addition, the tunnel oxide regions are not exposed to nitride or unnecessary high temperature processes, ensuring a high quality tunnel oxide.

Other aspects and advantages of the present invention can be seen upon review of the figures, the detailed description, and the claims which follow.

BRIEF DESCRIPTION OF THE FIGURES

FIG. 2A illustrates the formation of a patterned photoresist layer over a multilayer structure.

FIG. 2B illustrates the multilayer structure after having been patterned based on the patterned photoresist layer.

FIG. 2C illustrates the implantation of a dopant into the silicon substrate.

FIG. 2D illustrates the formation of an oxide layer over the memory array.

FIG. 2E illustrates the formation of sidewall spacers adjacent the multilayer lines.

FIG. 2F illustrates the formation of the isolation structure by a highly selective etch.

FIG. 2G illustrates the filling of the isolation structure and the formation of polysilicon lines over the multilayer lines.

DETAILED DESCRIPTION

Figure 1:
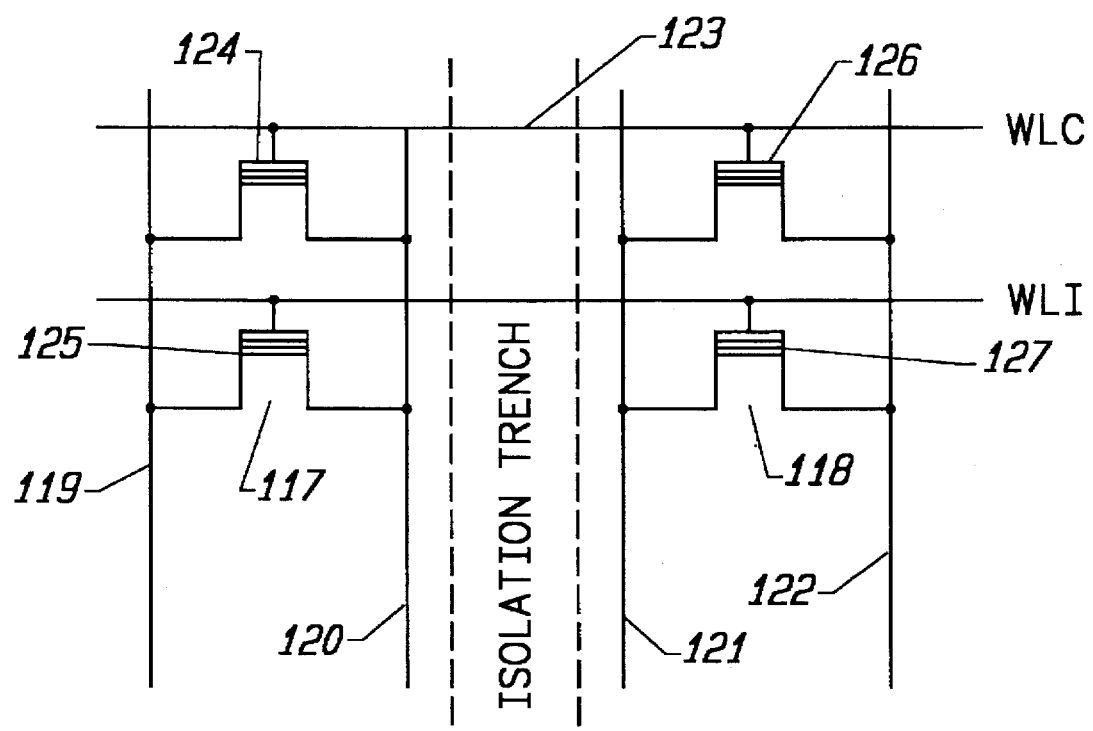
FIG. 1 is a schematic diagram of a high density memory array using an isolation trench structure according to the present invention.

A detailed description of preferred embodiment is provided with reference to the figures, in which FIG. 1 illustrates a representative high density memory array architecture with which the present invention can be utilized. FIGS. 2A through 2G illustrate a self-aligned isolation process for forming a memory array in which sidewall spacers are used to define the source and drain regions.

For context, FIG. 1 illustrates a high density memory array for a floating gate memory device, such as an EEPROM type flash memory. The architecture is based on a source-drain cell design in which each column of cells has a single buried diffusion local source line. An isolation structure is positioned between each column of cells. The isolation structure according to the present invention is an isolation trench oxide.

FIG. 1 also illustrates an architecture of the flash EEPROM array in which each column of flash EEPROM cells share a single metal bit line. FIG. 1 shows two segments of the array, where each segment includes a column of flash EPROM cells in a source-drain configuration. An isolation trench oxide 100 is formed between the two columns in this example.

The first segment 117 includes a drain diffusion line 119, a source diffusion line 120, and an isolation trench 123. The second segment 118 includes a drain diffusion line 121 and a source diffusion line 122. Included in the first segment are cell 124 and cell 125. Included in the second segment are cell 126 and cell 127. Cell 124 and 125 are attached to drain diffusion line 119 and source diffusion line 120. Cell 126 and 127 are attached to drain diffusion line 121 and source diffusion line 122. Word lines WL0 and WL1 each overlay the floating gates of a cell in each of the columns. As shown in the figure, wordline WL0 is attached to cell 124 and cell 126 and wordline WL1 is attached to cell 125 and 127.

Segments are laid out horizontally and vertically to provide an array of flash EEPROM cells comprising M word lines and N columns. The array requires N metal bit lines each of which is coupled to a column of flash EEPROM cells through select circuitry, as described above.

Figure 2A:
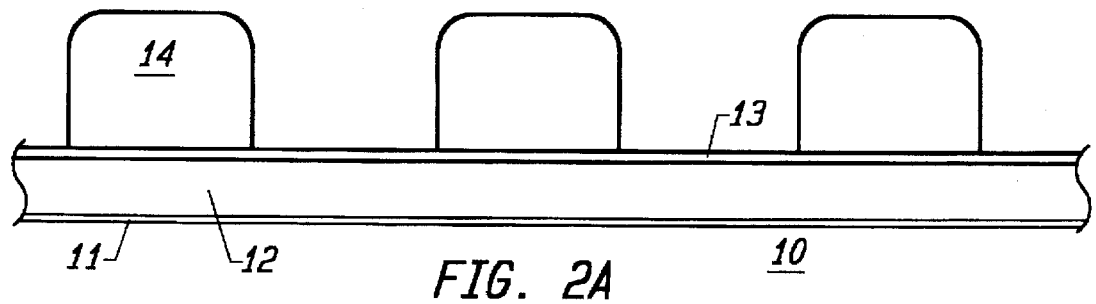
FIGS. 2A through 2G show the self-aligned isolation process used to form a memory array such as the array illustrated in FIG. 1 in which sidewall spacers are used to define the source and drain regions.

FIGS. 2A through 2G illustrate the process for forming the memory array of FIG. 1 according to the present invention. As illustrated in FIG. 2A, a silicon substrate 10 is provided. A conventional tunnel oxide 11 is formed to a thickness of about 5 nm to 20 nm over the semiconductor substrate 10 in the area of the memory array. Over the tunnel oxide, a first layer of polysilicon 12 is formed in the area of the array. The polysilicon may be deposited, for example, using standard chemical vapor deposition processes with a temperature at about 620° C., an ambient pressure of about 0.3 torr using silane gas with a flow rate of about 280 sccm to a thickness of about 20 nm to 200 nm. A layer of silicon dioxide 13 is formed over the polysilicon layer 12. The silicon dioxide layer 13 may be deposited, for example, as a thermal oxide or by chemical vapor deposition. An example of suitable CVD conditions for forming the oxide is s pressure of 0.82 torr, a temperature of 800° C. and using a flow rate of about 100 sccm. In one embodiment, the oxice layer has a thickness between about 2 nm and 100 nm. In another embodiment, the oxide layer has a thickness between about 50 nm and 100 nm.

Figure 2B:
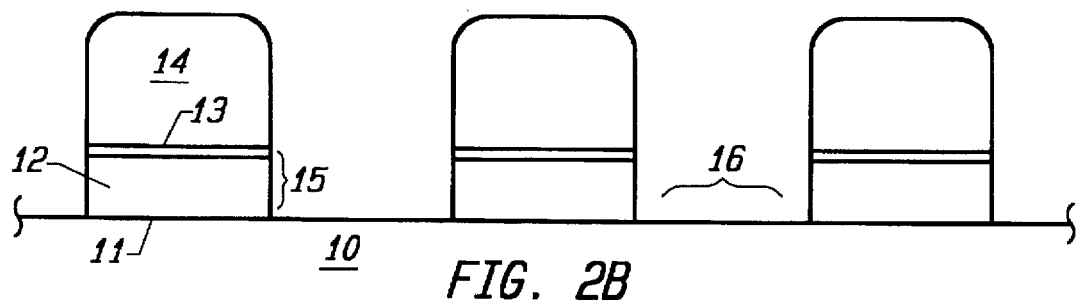

After the formation of this multilayer structure, a photoresist masking process is applied to define a plurality of columns. Thus, as shown in FIG. 2A, photoresist masks 14 are formed over the silicon dioxide layer 13. An etch process is applied, such as a plasma or reactive ion etch to expose the silicon substrate 10 in regions 16 between multilayer lines 15 as shown in FIG. 2B.

Figure 2C:
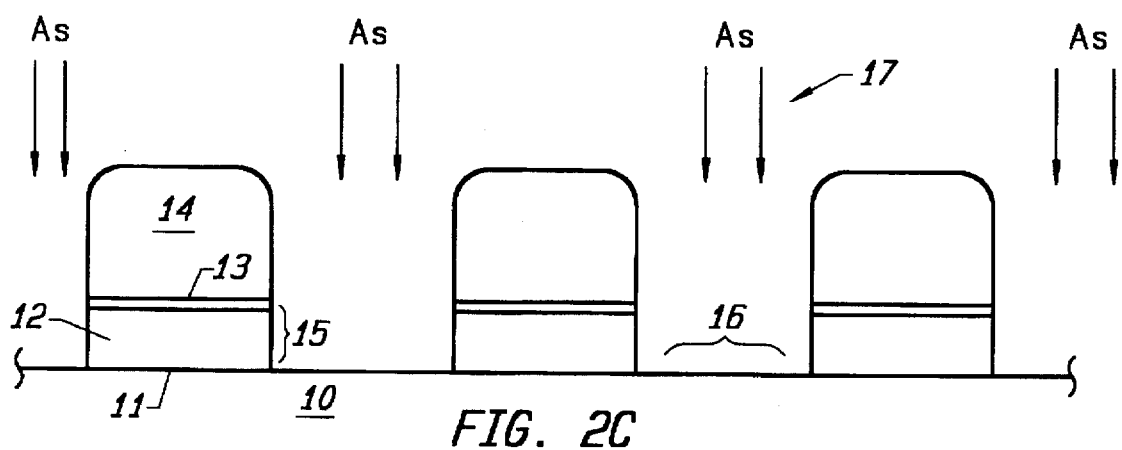

As illustrated in FIG. 2C, after exposing regions 16 of substrate, an implant process is executed to implant arsenic or other doping material, represented by the arrows generally 17, into the silicon substrate 10. These implanted regions 16 are later used to form source and drain regions. After the arsenic implant, the photoresist mask 14 is removed. Alternatively, depending on the nature of the oxide layer 13, the photoresist mask 14 may be removed before the implant.

Figure 2D:
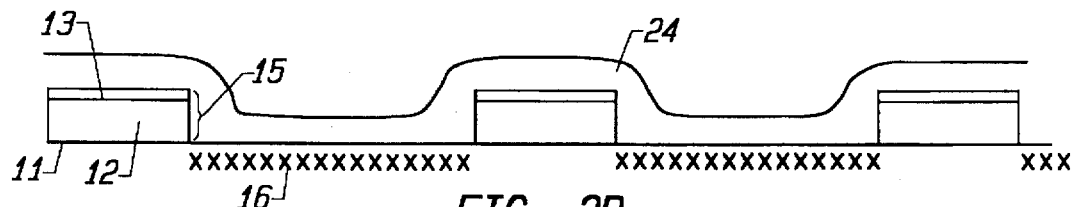
Figure 2E:
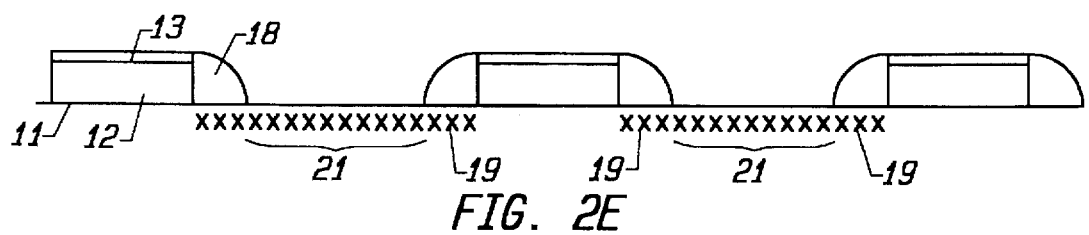

As illustrated in FIG. 2D, after the implant process, an oxide layer 24 is formed over the area of the memory array. As illustrated in FIG. 2E, the oxide layer 24 is then etched back to yield sidewall spacers 18 adjacent the multilayer lines 15. These sidewall spacers serve to partition the conductive region 16 into source and drain regions 19 and a region 21 in which an isolation trench will be formed.

Figure 2F:
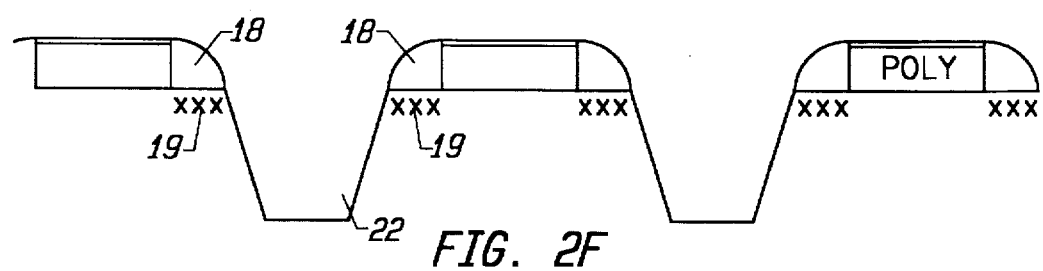

As illustrated in FIG. 2F, the isolation structure is formed by a highly selective etch process which etches the polysilicon and silicon substrate much faster than the oxide layer is covering the mutilayer lines and the oxide layer forming the sidewall spacers 18. The highly selective etch process may be performed, for example, in the presence of $O_2$ and HBr in the presence of $Cl_2$/He at a pressure of between about 5 mTorr and 60 mTorr and at a power of between about 100 and 300 watts.

Isolation trenches 22 are formed between the buried source and drain regions 19. The protective oxide forming the sidewall spacers and covering the multilayer lines is partially etched. However, because of the highly selective nature of the etch, the isolation trenches 22 are formed before the protective oxide is completely removed from the sidewall spacers and atop the multilayer lines.

The depth of the isolation trenches 22 is preferably about 0.3 to about 0.5 microns for a device using a similar critical dimension width of the polysilicon lines. Isolation openings totally above the substrate, or having depths lesser or greater than this example can be formed as suits a particular application.

After formation of the trench as illustrated in FIG. 2F, insulating material is applied to fill the trench. The preferred insulation material is an oxide which can be deposited, for example, using a chemical vapor deposition process using a mixture of $N_2O/SiH_2Cl_2$ with a flow rate of about 180 sccm to 90 sccm at about 800° C. with an ambient pressure of about 0.4 torr. The deposition time for this process is proportional to the oxide thickness. Alternatively, a TEOS process can be applied, using a commercial TEOS material with a flow rate of about 100 sccm at about 700° C. with an ambient pressure of about 0.82 torr. The deposition time is proportional to the oxide thickness.

After the insulating material 23 is introduced to fill the trench, an etch back is performed which is stopped at the top of the polysilicon layers 12 to planarize the regions 25 between the remaining polysilicon lines, including in the isolation region.

Figure 2G:
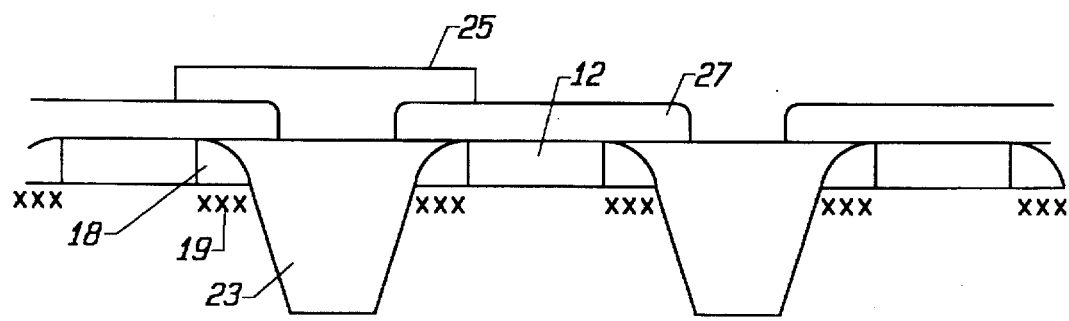

After planarization, a pattern of polysilicon lines 27 is formed over the remaining polysilicon lines 12, and in electrical contact with them as shown in FIG. 2G. The top polysilicon lines 27 are slightly wider than the underlying polysilicon lines 12, in order to extend the area of the floating gate structure.

Subsequent to deposition of the polysilicon lines 27, an interpoly dielectric, such as ONO, is formed over the structure, and a mask/etch process is applied to form the floating gate structures and word lines in lines along a direction substantially orthogonal to the isolation trenches 22.

The block select and array source voltage connectors are formed as described in co-pending PCT patent application number PCT/US94/10276, entitled A FLASH EPROM TRANSISTOR ARRAY AND METHOD FOR MANUFACTURING THE SAME; filed Sep. 13, 1994, which is incorporated by reference as if fully set forth herein. Thus, after overlying wordlines, block select structures, and metalization, a high density flash memory array is formed with self-aligned isolation/planarization structures.

Thus, with respect to FIGS. 2A through 2G, the present invention has been described in which the polysilicon lines selected define an isolation trench between each two lines. In other memory array architectures, the isolation trenches might by placed according to other patterns, such as every Nth line. The process of the present invention for forming isolation trenches using sidewall spacers may be used with a variety of techniques for forming different memory array architectures.

In addition, the isolation structures need not be straight parallel lines as described above. The same process can be used to form more complicated isolation shapes such as might be used in the block select structures and the like within the memory array.

Accordingly, the present invention provides a self-aligned isolation process particularly suited to the formation of high density read-only or floating gate memory arrays, with very small critical dimensions in the submicron range. The process results in greater uniformity in cell layout, higher density, and fewer process steps over the prior art. Further, the process does not involve exposing the sensitive tunnel oxide regions to nitrides and excessive thermal stress, such as encountered in prior art approaches.

The foregoing description of preferred embodiments of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A method for manufacturing an integrated circuit, comprising:

forming a patterned multilayer structure having a plurality of multilayer lines, and openings between the multilayer lines on a semiconductor substrate, the multilayer structure including a first insulating layer and conductive layer;

depositing a dope material in the semiconductor substrate through the openings to define a plurality of source or drain regions adjacent the multilayer lines;

forming sidewall spacers over the source or drain regions adjacent the multilayer lines, each sidewall spacer having a width which defines a width of a source or drain region, the portion of each opening not covered by a sidewall spacer defining an isolation region;

selectively etching the silicon substrate in the isolation regions to form isolation openings in the isolation regions; and filling the isolation openings with a second insulating material.

2. The method of claim 1 wherein the first insulating layer in the multilayer structure has a thickness of between about 20 nm and 200 nm.

3. The method of claim 1 wherein the conductive layer in the multilayer structure has a thickness of between about 5 nm and 20 nm.

4. The method of claim 1 wherein the openings between the multilayer lines have widths less than about 500 nm.

5. The method of claim 1 wherein the sidewall spacer has a width of between about 150 nm and 200 nm.

6. The method of claim 1 wherein the isolation openings have widths less than about 200 nm.

7. The method of claim 1, wherein the step of filling the isolation openings includes filling the isolation openings so that the second insulating material is substantially coplanar with a top surface of the multilayer lines.

8. The method of claim 7, wherein the step of filling the isolation openings includes filling the isolation openings so that the second insulating material is higher than the top surface of the multilayer lines, and etching the insulating material so that the second insulating material is substantially coplanar with a top surface of the multilayer lines.

9. A method for manufacturing an integrated circuit, comprising:

forming a patterned multilayer structure having a plurality of multilayer lines, and openings between the multilayer lines on a semiconductor substrate, the multilayer structure including a first insulating layer and conductive layer;

depositing a dope material in the semiconductor substrate through the openings to define a plurality of source or drain regions adjacent the multilayer lines;

forming sidewall spacers over the source or drain regions adjacent the multilayer lines, each sidewall spacer having a width which defines a width of a source or drain region, the portion of each opening not covered by a sidewall spacer defining an isolation region;

selectively etching the silicon substrate in the isolation regions to form isolation openings in the isolation regions;

filling the isolation openings with a second insulating material forming a second plurality of lines of conductive material over and in electrical contact with the multilayer lines to form composite floating gate conductors, the multilayer lines having first widths, and the second plurality of lines of conductive material having second widths which are greater than the first widths;

etching a pattern in composite floating gate conductors to form floating gate structures; and forming insulators and wordlines over the floating gate structures.

10. The method of claim 1, wherein the step of forming a patterned multilayer structure includes:

forming an insulating layer on the semiconductor substrate; and forming a layer of conductive material on the insulating layer.

11. The method of claim 1, wherein the first layer of insulating material comprises silicon dioxide and the layer of conductive material comprises polycrystalline silicon (polysilicon).

12. The method of claim 1, including:

forming a protective layer of material over the layer of conductive material to protect the multilayer lines from etching during the formation of isolation openings in the isolation regions.

13. The method of claim 12, wherein the protective material comprises silicon dioxide.

14. A method for manufacturing a floating gate memory array on an integrated circuit, comprising:

forming a multilayer structure on a semiconductor substrate including a tunnel insulating layer and a floating gate layer;

etching a pattern in the multilayer structure to form a patterned multilayer structure having a plurality of substantially parallel multilayer lines and an opening between adjacent multilayer lines;

depositing a dope material in the semiconductor substrate through the openings to define a plurality of buried diffusion conductive regions in the semiconductor substrate;

forming sidewall spacers over the buried diffusion conductive regions adjacent the multilayer lines, the portion of the conductive region covered by a sidewall spacer defining either a source or a drain region, the portion of the conductive region not covered by a sidewall spacer defining an isolation region;

selectively etching the silicon substrate in the isolation regions to form isolation openings in the isolation regions; and filling the isolation openings with a second insulating material;

etching a pattern in the multilayer lines to form floating gate structures;

forming wordline insulators over the floating gate structures; and forming wordlines orthogonal to the buried diffusion conductive regions and over the wordline insulators on the floating gate structures.

15. The method of claim 14 wherein the first insulating layer in the multilayer structure has a thickness of between about 20 nm and 200 nm.

16. The method of claim 14 wherein the conductive layer in the multilayer structure has a thickness of between about 5 nm and 20 nm.

17. The method of claim 14 wherein the openings between the multilayer lines have widths between about less than about 500 nm.

18. The method of claim 14 wherein the sidewall spacer has a width of between about 150 nm and 200 nm.

19. The method of claim 14 wherein the isolation openings have widths less than about 200 nm.

20. The method of claim 14 wherein the step of filling the isolation openings includes filling the isolation openings so that the second insulating material is substantially coplanar with a top surface of the multilayer lines.

21. The method of claim 20, wherein the step of filling the isolation openings includes filling the isolation openings so that the second insulating material is higher than the top surface of the multilayer lines, and etching the insulating material so that the second insulating material is substantially coplanar with a top surface of the multilayer lines.

22. The method of claim 14, including after the step of filling, forming a second plurality of lines of conductive material over and in electrical contact with the multilayer lines to form composite floating gate conductors, the multilayer lines having first widths, and the second plurality of lines of conductive material having second widths which are greater than the first widths;

etching a pattern in composite floating gate conductors to form floating gate structures; and forming insulators and wordlines over the floating gate structures.

23. The method of claim 14, wherein the step of forming a patterned multilayer structure includes:

forming an insulating layer on the semiconductor substrate; and forming a layer of conductive material on the insulating layer.

24. The method of claim 14 wherein the first layer of insulating material comprises silicon dioxide and the layer of conductive material comprises polycrystalline silicon (polysilicon).

25. The method of claim 14, further including the step of:

forming a protective layer of material over the layer of conductive material to protect the multilayer lines from etching during the formation of isolation openings in the isolation regions.

26. The method of claim 25, wherein the protective material comprises silicon dioxide.

27. A method for manufacturing a floating gate memory array on an integrated circuit, comprising:

forming a multilayer structure on a semiconductor substrate including a tunnel insulating layer, a floating gate layer, and a layer of protective material over the floating gate material, the protective material protecting the floating gate material from a subsequent process step;

etching a pattern in the multilayer structure to form a patterned multilayer structure having a plurality of substantially parallel multilayer lines and an opening between adjacent multilayer lines;

depositing a dope material in the semiconductor substrate through the openings to define a plurality of substantially parallel, buried diffusion conductive regions in the semiconductor substrate;

forming sidewall spacers over the buried diffusion conductive regions adjacent the multilayer lines, the portion of the conductive region covered by a sidewall spacer defining either a source or a drain region, the portion of the conductive region not covered by a sidewall spacer defining an isolation region;

selectively etching the silicon substrate in the isolation regions to form isolation openings in the isolation regions; and filling the isolation openings with a second insulating material;

etching a pattern in the multilayer lines to form floating gate structures;

forming wordline insulators over the floating gate structures; and forming wordlines orthogonal to the buried diffusion conductive regions and over the wordline insulators on the floating gate structures.

28. The method of claim 27, including:

removing the layer of protective material on the multilayer lines after the step of forming the isolation openings; and forming, after the step of filling, a second plurality of lines of conductive material over and in electrical contact with the remaining multilayer lines in the plurality of multilayer lines to form composite floating gate conductors, the plurality of multilayer lines having first widths, and the second plurality of lines of conductive material having second widths greater than the first widths; and wherein the step of etching to form floating gate structures includes etching the composite floating gate conductors.

29. The method of claim 28 wherein the first insulating layer in the multilayer structure has a thickness of between about 20 nm and 200 nm.

30. The method of claim 28 wherein the conductive layer in the multilayer structure has a thickness of between about 5 nm and 20 nm.

31. The method of claim 28 wherein the openings between the multilayer lines have widths between about less than about 500 nm.

32. The method of claim 28 wherein the sidewall spacer has a width of between about 150 nm and 200 nm.

33. The method of claim 28 wherein the isolation openings have widths less than about 200 nm.

34. The method of claim 28 wherein the step of filling the isolation openings includes filling the isolation openings so that the second insulating material is substantially coplanar with a top surface of the multilayer lines.

35. The method of claim 28 wherein the first layer of insulating material comprises silicon dioxide and the layer of conductive material comprises polycrystalline silicon (polysilicon).

36. The method of claim 35, wherein the protective material comprises silicon dioxide.

* * * * *